United States Patent [19]

Doerfler et al.

[11] Patent Number: 4,947,107
[45] Date of Patent: Aug. 7, 1990

[54] MAGNETO-OPTIC CURRENT SENSOR

[75] Inventors: Ronald W. Doerfler; Terrill G. Power; Stephen R. Jones; William R. Owens, all of Rockford, Ill.

[73] Assignee: Sundstrand Corporation, Rockford, Ill.

[21] Appl. No.: 212,579

[22] Filed: Jun. 28, 1988

[51] Int. Cl.$^5$ .......................................... G01R 33/032
[52] U.S. Cl. ..................................... 324/96; 324/244; 324/117 R; 250/227.17; 350/375; 350/96.17; 356/345; 356/351
[58] Field of Search ............. 324/244, 96, 262, 117 R; 350/375–378, 96.18, 413, 96; 250/225, 227.14, 227.17; 356/368, 345, 351; 65/3.11; 332/7.51

[56] References Cited

U.S. PATENT DOCUMENTS

| | | | |
|---|---|---|---|
| 3,324,393 | 6/1967 | Casey et al. | 324/96 |
| 3,419,802 | 12/1968 | Pelenc et al. | 324/96 |
| 3,502,978 | 3/1970 | Bernard et al. | 324/96 |
| 3,581,202 | 5/1971 | Pelenc et al. | 324/96 |
| 3,590,374 | 6/1971 | Evans et al. | 324/96 |
| 3,597,683 | 8/1971 | Salto | 324/96 |
| 3,605,013 | 9/1971 | Yoshikawa et al. | 324/96 |
| 3,679,969 | 7/1972 | Fussell | 324/244 |
| 3,693,082 | 9/1972 | Jaecklin | 324/96 |
| 3,708,747 | 1/1973 | Lesueur | 324/96 |
| 3,746,983 | 7/1973 | Renz | 324/96 |
| 3,978,334 | 8/1976 | McCardell | 250/225 |
| 3,980,949 | 9/1976 | Feldtkeller | 324/96 |
| 4,070,620 | 1/1978 | Feldtkeller | 324/96 |
| 4,070,622 | 1/1978 | Harms et al. | 324/96 |
| 4,112,367 | 9/1978 | Hepner et al. | 324/244 |
| 4,232,264 | 11/1980 | Papp et al. | 324/96 |
| 4,243,936 | 1/1981 | Papp et al. | 324/96 |
| 4,255,018 | 3/1981 | Ulrich et al. | 350/375 |
| 4,334,781 | 6/1982 | Ozeki | 356/368 |
| 4,348,587 | 9/1982 | Tangonan et al. | 250/227 |
| 4,355,864 | 10/1982 | Soref | 350/96.18 |
| 4,363,061 | 12/1982 | Vaerewyck et al. | 361/31 |
| 4,370,612 | 1/1983 | Puech et al. | 324/117 R |
| 4,428,017 | 1/1984 | Vaerewyck et al. | 361/31 |
| 4,449,096 | 5/1984 | Doriath et al. | 324/244 |
| 4,516,073 | 5/1985 | Doriath et al. | 324/244 |
| 4,529,875 | 7/1985 | Brogardh et al. | 250/227 |
| 4,531,092 | 7/1985 | Shibano | 324/244 |

(List continued on next page.)

OTHER PUBLICATIONS

Gama, "System Design Considerations for Precision Measurements of High Magnetic Fields, by Faraday Effect", *Optical and Quantum Electronics*, vol. 7, No. 6, Nov. 1975, pp. 493–504.

Primary Examiner—Reinhard J. Eisenzopf
Assistant Examiner—Warren S. Edmonds
Attorney, Agent, or Firm—Antonelli, Terry, Stout & Kraus

[57] ABSTRACT

A sensor (10) for sensing the magnitude of current flowing in a conductor (12) based upon the Faraday effect is disclosed. The invention utilizes a magneto-optic material having one or more layers (32) in which alignment with an optical fiber is not critical in achieving accurate current measurements. A magneto-optic material (28) in accordance with the invention includes one or more layers (32) each having a substrate having opposed surfaces coated with a material exhibiting the Faraday effect in which light from a light source is transmitted through the magneto-optic element without substantial internal reflection and is incident upon a surface area of the coating which is greater than the surface area of the beam of light. Furthermore, the invention measures the magnitude of current flowing in the conductor accurately by utilizing null detection for a first range of current values from zero to a first magnitude having either of two possible polarities and measures a second range of current values extending from the first magnitude to a second magnitude having either of the two possible polarities in which null detection is not utilized. By not utilizing null detection for the second range of current values, circuit response time is enhanced by allowing the inductance of the nulling coil to be reduced. Transient response is thus improved.

28 Claims, 3 Drawing Sheets

U.S. PATENT DOCUMENTS

| | | | |
|---|---|---|---|
| 4,539,519 | 9/1985 | Ulrich | 324/117 R |
| 4,539,521 | 9/1985 | Matsumoto | 324/244 |
| 4,540,937 | 9/1985 | Asars | 324/96 |
| 4,560,932 | 12/1985 | Mitsui et al. | 324/244 |
| 4,563,639 | 1/1986 | Langeac | 324/96 |
| 4,563,646 | 1/1986 | Desormiere | 324/244 |
| 4,564,754 | 1/1986 | Sato et al. | 250/225 |
| 4,578,639 | 3/1986 | Miller | 324/96 |
| 4,581,579 | 4/1986 | Nagatsuma et al. | 324/244 |
| 4,612,500 | 9/1986 | Chen et al. | 324/96 |
| 4,613,811 | 9/1986 | Vaerewyck et al. | 324/96 |
| 4,621,192 | 11/1986 | Duthoit et al. | 324/244 X |
| 4,631,402 | 12/1986 | Nagatsuma et al. | 250/231 R |
| 4,668,053 | 5/1987 | Nishi et al. | 350/413 |
| 4,683,421 | 7/1987 | Miller et al. | 324/96 |
| 4,697,145 | 9/1987 | Doriath et al. | 324/244 |
| 4,698,497 | 10/1987 | Miller et al. | 324/96 |
| 4,815,807 | 3/1989 | Kaneko et al. | 350/96.18 |

# 4,947,107

MAGNETO-OPTIC CURRENT SENSOR

TECHNICAL FIELD

The present invention relates to current sensors which do not require connection of electrical circuitry to the circuit whose current is being sensed. More specifically, the invention relates to current sensors of the aforementioned type utilizing the Faraday effect.

BACKGROUND ART

Numerous current measuring devices and magnetometers have been developed based upon the Faraday effect. The Faraday effect causes the plane of polarization of a polarized beam of light passing through a transparent substance exhibiting the Faraday effect to rotate from the plane of polarization of the incident light by an amount proportional to the magnetic field passing through the substance parallel to the optical axis of the beam of light.

U.S. Pat. Nos. 3,324,393, 3,419,802, 3,502,978, 3,581,202, 3,590,374, 3,597,683, 3,605,013, 3,693,082, 3,708,747, 3,746,983, 3,978,334, 3,980,949, 4,070,620, 4,070,622, 4,112,367, 4,232,264, 4,243,936, 4,255,018, 4,348,587, 4,363,061, 4,370,612, 4,428,017, 4,516,073, 4,529,875, 4,531,092, 4,539,519, 4,539,521, 4,540,937, 4,563,639, 4,563,646, 4,564,754, 4,578,639, 4,581,579, 4,612,500, 4,613,811, 4,631,402, 4,683,421, and 4,698,497, disclose current or magnetic field sensors based upon the Faraday effect.

Magneto-optic materials exhibiting the Faraday effect have been developed and are commercially available which have a substrate of gadolinium gallium garnet which is coated with a layer of yttrium iron garnet. For example, the aforementioned material is available with a 45 micron thickness coating having substituted bismuth with a relatively large lattice constant from the Airtron Division of Litton Industries In the prior art the usage of these types of materials has been based upon a direct connection of an optical fiber to a wafer of the aforementioned material which functions to transmit a plane polarized beam of light emitting from the end of the optical fiber by means of internal reflection in the material. The reason that internal reflection is necessary to transmit the light is that the light exiting an optical fiber has substantial divergence. The rays of light emanating from the end of the optical fiber therefore have varying light paths which must be internally reflected in order for the light beam to traverse the material exhibiting the Faraday effect. See FIG. 2 of U.S. Pat. No. 4,112,367. Additionally, U.S. Pat. No. 4,560,932 discloses a Faraday effect material in which the light traverses the material by repeated reflections from a reflective layer 15. Additionally, U.S. Pat. No. 4,516,073, which is referred to above, discloses the direct connection of an optical fiber to the end of a layer of yttrium iron garnet. Although not specifically discussed in the '073 patent, the direct connection of the optical fiber to the yttrium iron garnet layer necessarily results in internal reflection from the outside surfaces of the layer because of the aforementioned divergence of light at the end of an optical fiber.

DISCLOSURE OF THE INVENTION

The present invention provides a current measuring device especially useful for application where weight is a consideration such as airframes and further which does not require any electrical connections to the current conductor on which current measurement is to be made. Current sensing techniques used on airframes have utilized series resistors, current transformers and Hall effect devices. These devices have one or more of the following disadvantages: significant power dissipation, additional impedance in the circuit containing the current carrying conductor, restricted bandwidth, saturation, hysteresis, lack of voltage isolation, large size, large mass, and the necessity for breaking the conductor to insert the device.

The present invention provides an improved Faraday effect device in which the necessity for accurate alignment of an optical fiber with the material exhibiting the Faraday effect is eliminated.

Furthermore, the present invention provides an improved Faraday effect current sensor utilizing nulling in which a first range of current values can be accurately measured based upon nulling and further in which a second larger range of current values can be measured without nulling. The aforementioned two ranges provide the capability of accurate measurement of DC or AC currents as well as the ability to measure high magnitude current transients. The present invention provides high speed sensing of transient current values having frequency components beyond the frequency response characteristic of the nulling circuit.

Finally, the present invention provides a current sensor based upon the Faraday effect in which criticality in the alignment of an optical fiber and the Faraday effect material is eliminated and which further permits the accurate measurement of currents in a first range from zero to a first current magnitude having either of two possible polarities based upon nulling and further permits the measurement of current magnitudes of either of two possible polarities in a second range larger than the first range including currents of a transient nature in which the transients may have higher frequency components than the response characteristic of the nulling circuit.

A sensor for sensing the magnitude of a magnetic field in accordance with the invention includes a light source for emitting light to be transmitted through the magnetic field to be measured; optical apparatus optically coupled to the light source for collimating the light emitted from the light source into a beam having a cross sectional area; a polarizer optically coupled to the beam for polarizing the light beam into a first plane of polarization; a magneto-optic element optically coupled to the polarizer which receives the light beam on an input side with the light beam passing through the element without substantial internal reflection and which outputs the light on a discharge side, the element rotating the plane of polarization of the input beam in proportion to a magnetic field coupled in parallel to an optical axis of the beam passing through the element and comprising at least one layer with each layer having a substrate coated with a material exhibiting the Faraday effect with each layer having a cross sectional area of coating intercepted by the light beam which is equal to or greater in surface area than the cross sectional area of the light beam intercepting the layer; and circuitry, coupled to the light beam outputted from the output of the magneto-optic element for producing an output proportional to the magnitude of the magnetic field. Preferably, the magneto-optic element has a plurality of layers with each surface of each layer rotating the plane of polarization of the light beam intercepting the coating of the layer by a fixed amount with the amount of rotation of the light beams by the element being directly proportional to the number of layers. Preferably, the layers are stacked together with the easy axis of each of the layers being parallel to each other with the optical axis of the light beam passing through the element being parallel to the easy access of the layers. Each layer may have a substrate of gadolinium gallium garnet; and a coating of bismuth substituted yttrium iron garnet disposed on each surface of the substrate which is intercepted by the light beam. The apparatus optically coupled to the light source has an optical fiber having first and second ends, the first end being optically coupled to the light source; and a gradient index lens having a first surface optically coupled to the second end of the optical fiber and a second surface for outputting the collimated beam of light. The gradient index lens may be a 0.25 pitch gradient index lens.

In a magneto-optic current sensor for measuring the magnitude of current flowing in a conductor with a magneto-optic material through which a plane polarized light beam is transmitted that is magnetically coupled with a magnetic field produced by the current which causes rotation of the plane polarized light beam by an amount proportional to the current, a nulling circuit for producing a current which is applied to a coil magnetically linked with the magneto-optic material to cause the plane of polarization of the light beam to be rotated by an amount equal in magnitude and opposite in direction to the rotation caused by the sensed current comprises an apparatus for providing a signal proportional to the angle of rotation in the magneto-optic material; a comparator or amplifier producing an output signal of a first level when the signal is greater than a predetermined value and a second level when the signal is less than a predetermined value; a circuit, coupled to the comparator or amplifier, for producing the current which is applied to the coil and a signal proportional to the current flowing in the coil; another amplifier, coupled to the circuit for producing a signal proportional to the sensed angle of rotation, for providing an amplified output signal; and a summer for summing a signal which is a function of the output signal and the signal from the another amplifier to produce an output signal proportional to the current flowing in the conductor. The gain of the comparator or amplifier may be larger than the gain of the another amplifier. The circuit for producing the current which is applied to the coil and a signal proportional to the current flowing in the coil comprises a coil driving amplifier, coupled to the output of the comparator or amplifier, for amplifying the output signal from the comparator or amplifier; a resistor coupled in series between an output of the coil driving amplifier and the coil; and a differential amplifier having a pair of inputs respectively coupled across the resistor for amplifying a voltage drop across the resistor to produce an output which is proportional to the current flowing in the coil driver, the output of the differential amplifier being coupled to the summer.

A magneto-optic current sensor for measuring the magnitude of current flowing in a conductor with a magneto-optic material through which a plane polarized light beam is transmitted that is oriented in parallel with a magnetic field produced by the current which causes rotation of the plane polarized light beam by an amount proportional to the current in accordance with the invention includes a first circuit responsive to the sensed angle of rotation of the plane of polarization for producing a current which is applied to a coil magnetically linked with the magneto-optic material to cause the plane of polarization of the light beam to be rotated by an amount equal in magnitude and opposite to the rotation caused by the sensed current when the sensed current is in a first range of current values; and a second circuit responsive to a sensed angle of rotation of the plane of polarization, for producing a signal which is proportional to the sensed angle of rotation in a second range of current values larger than the first range of current values; an output responsive to the first circuit and the second circuit for producing an output signal proportional to the current flowing in the conductor in the first and second ranges. The first range is from zero to a first current magnitude having either of two possible polarities and the second range is from the first current magnitude to a second larger current magnitude having either of the two possible current magnitudes. The first circuit includes a comparator or amplifier producing an output of a first level when a signal proportional to the sensed angle of rotation is greater than a predetermined value and an output of a second level when a signal proportional to the sensed angle of rotation is less than a predetermined value and a circuit, coupled to the comparator or amplifier for producing the current which is applied to the coil and a signal proportional to the current flowing in the coil. The second circuit includes another amplifier coupled to the signal proportional to the sensed angle of rotation for producing an amplified output signal. The output includes a summer for summing the output signal from the another amplifier and the circuit for producing the current which is applied to the coil and a signal proportional to the current flowing in the coil to produce an output signal proportional to the current flowing in the conductor. The comparator or amplifier has a gain which preferably is larger than the gain of the another amplifier. The circuit for producing the current which is applied to the coil and a signal proportional to the current flowing in the coil comprises a coil driving amplifier, coupled to the output of the comparator or amplifier, for amplifying the output signal from the comparator or amplifier; a resistor coupled in series between an output of the coil driving amplifier and the coil; and a differential amplifier having a pair of inputs respectively coupled across the resistor for amplifying a voltage drop across the resistor to produce an output which is proportional to the current flowing in the coil driver, the output of the differential amplifier being coupled to the summer.

A magneto-optic current sensor for sensing the magnitude of current flowing in a conductor in accordance with the present invention comprises a light source for emitting light to be transmitted; a collimator optically coupled to the light source for collimating the light emitted from the light source into a beam having a cross sectional area; a polarizer optically coupled to the beam for polarizing the light beam into a first plane of polarization; a magneto-optic element optically coupled to the polarizer which receives the light beam on an input side with the light beam passing through the element without substantial internal reflection and outputs the light on a discharge side, the element rotating the plane of polarization of the input beam in proportion to a magnetic field coupled in parallel to an optical axis of the light beam passing through the element and comprising at least one layer with each layer having a substrate coated with a material exhibiting the Faraday effect with each layer having a cross sectional area of coating intercepted by the light beam which is equal to or greater in surface area than the cross-sectional area of the light beam intercepting the layer; a circuit, coupled to the light beam outputted from the output of the magneto-optic element, for producing an output proportional to the magnitude of the rotation of the plane of polarization in the elements; first circuitry, responsive to the output proportional to the angle of the rotation of the plane of polarization for producing a signal proportional to the current flowing in the coil and a current which is applied to a coil magnetically coupled with the element to cause the plane of polarization to be rotated by an amount equal in magnitude and opposite in direction to the rotation caused by the sensed current when the sensed current is in a first range of current values; second circuitry, responsive to the output proportional to the angle of rotation of the plane of polarization, for producing a signal which is proportional to the sensed angle of rotation in a second range of current values larger than the first range of current values; and an output, responsive to the first circuitry and the second circuitry for producing an output signal proportional to the current flowing in the conductor in the first and second ranges. The magneto-optic element has a plurality of layers with each surface of each layer rotating the plane of polarization of the light beam intercepting the coating of the layer by a fixed amount with the amount of rotation of the light beam by the element being directly proportional to the number of layers. Each layer of the element has an easy axis of magnetization with the easy axis of each of the layers being parallel to each other with the optical axis of the light beam passing through the element being parallel to the easy axis of the layers. Each layer may have a substrate of gadolinium gallium garnet and a coating of bismuth substituted yttrium iron garnet disposed on each surface of the substrate intercepting the light beam. The collimator optically coupled to the light source comprises an optical fiber having first and second ends, the first end being optically coupled to the light source, and a gradient index lens having a first surface optically coupled to the second end of the optical fiber and a second surface for outputting the collimated beam of light. The gradient index lens may be a 0.25 pitch gradient index lens. The first range is from zero to a first current magnitude having either of two possible polarities; and the second range is from the first current magnitude to a second larger current magnitude having either the two possible polarities. The first circuitry includes a comparator or amplifier for producing an output of a first level when a signal proportional to the sensed angle of rotation is greater than a predetermined value and an output of a second level when the signal proportional to the sensed angle of rotation is less than the predetermined value and a circuit, coupled to the comparator or amplifier for producing a signal proportional to the current flowing in the coil and the current which is applied to the coil. The second circuitry includes another amplifier coupled to the signal proportional to the sensed angle of rotation for producing an amplified output signal. The output includes a summer for summing the output signal from the another amplifier and the circuit for producing a signal proportional to the current flowing in the coil and the current which is applied to the coil to produce an output signal proportional to the current flowing in the conductor. The comparator or amplifier preferably has a gain larger than the gain of the another amplifier. The circuitry for producing a signal proportional to the current flowing in the coil and the current which is applied to the coil comprises a coil driving amplifier coupled to the output of the comparator or amplifier for amplifying the output signal from the comparator or amplifier; a resistor coupled between an output of the coil driving amplifier and the coil; and a differential amplifier having a pair of inputs respectively coupled across the resistor for amplifying a voltage drop across the resistor to produce an output which is proportional to the current flowing in the coil, the output of the differential amplifier being coupled to the summer.

BEST MODE FOR CARRYING OUT THE INVENTION

Figure 1:
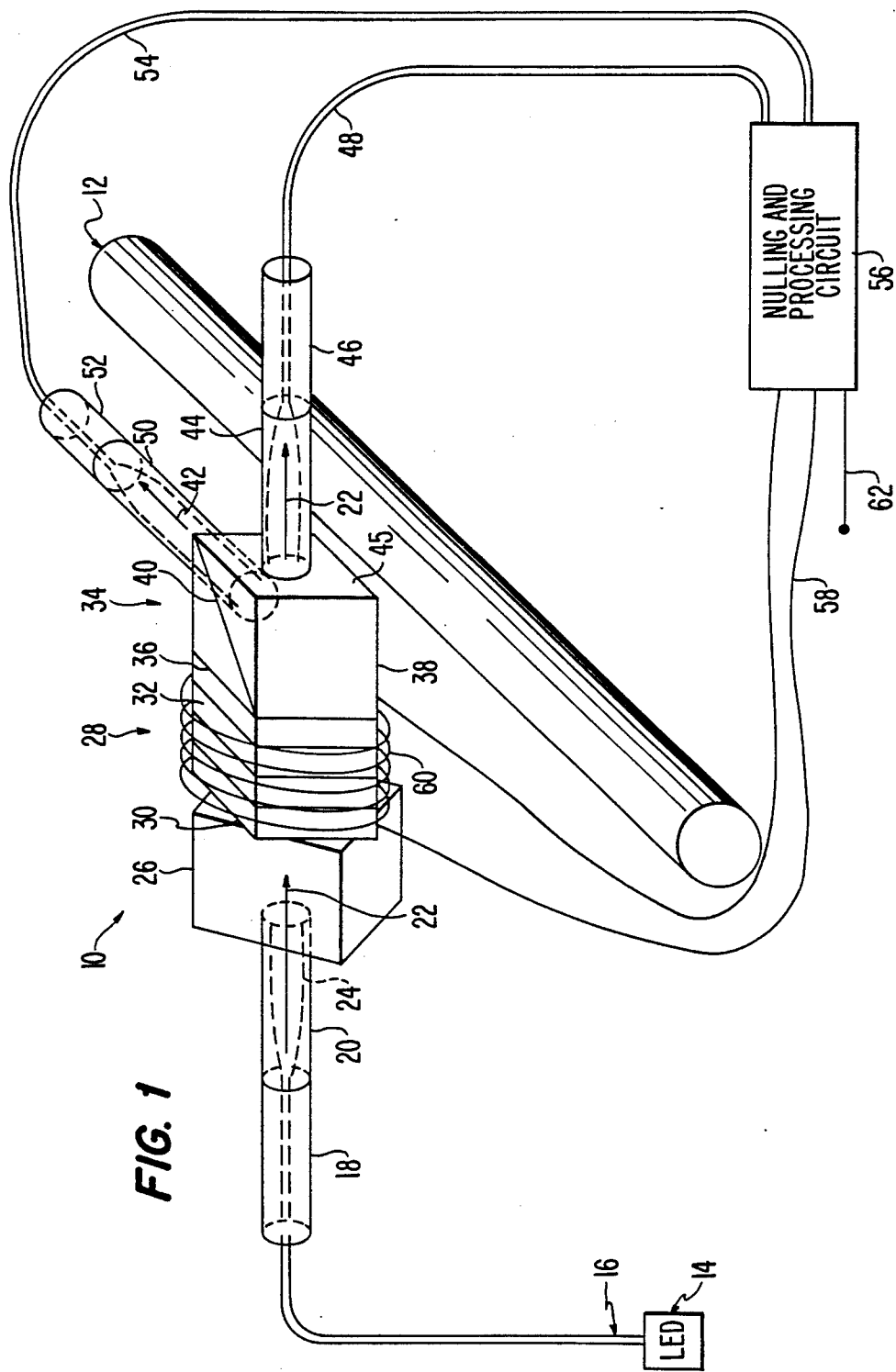
FIG. 1 illustrates an embodiment of the present invention.

FIG. 1 illustrates an embodiment 10 of the present invention which functions to measure the magnitude of current flowing in a conductor 12 utilizing the Faraday effect without electrical connection to the conductor. It should be understood that the present invention will measure both DC and AC currents. The overall mode of operation is based upon the Faraday effect which causes a rotation of a plane polarized beam of light passing through a material exhibiting the Faraday effect which is directly proportional to the magnitude of current flow in the conductor 12. A light emitting diode 14 is optically coupled to a conventional optical fiber of the multimode type. The light emitting diode 14 may emit light in the wavelength of 1300 nm. The optical fiber 16 is connected to a ceramic ferrule 18 to which is attached a gradient index lens 20. The gradient index lens may be a 0.25 gradient index lens. As has been mentioned above with regard to the prior art, the light emitted from the end of an optical fiber is divergent. The ceramic ferrule 18 and gradient index lens 20 function as a collimator to produce an output beam of collimated (substantially parallel) light travelling along optical axis 22 which is generally indicated by an arrow within a cross-sectional area delineated by the dotted lines 24. The light beam intercepts a plane polarizer 26 which polarizes the beam of light exiting from the gradient index lens 20 into a first plane of polarization. The polarizer 26 may be a conventional polarizing beam splitter.

A magneto-optic element 28 exhibiting the Faraday effect is optically coupled to the plane polarizer 26 to cause rotation of the plane of polarization of the beam exiting the plane polarizer 26, which enters the front face 30 of the magneto-optic element 28, by an amount proportional to the current flowing in conductor 12. As is known, the plane of polarization of a plane polarized beam entering a magneto-optic element is rotated in direct proportion to the magnitude of the magnetic field coupled in parallel to the optical axis through the magneto-optic element. The orthogonal orientation of the conductor 12 insures that the magnetic field will have components of lines of flux parallel to the optical axis 22 so that the plane of polarization of the light beam incident on the magneto-optic element 28 is rotated in direct proportion to the magnitude of the current flowing in the conductor.

An important aspect of the present invention is that the cross sectional area 24 of the light beam exiting from the gradient index lens 20 is smaller than the surface area of the front face 30 of each of the layers 32 of the magneto optic element 28 described below. This geometry insures that there is no alignment problem required for attachment of either the gradient index lens 20 or the polarizer 26 to the front face 30 of the magneto-optic element 28. A conventional optical polarizing analyzing system 34 is attached to the rear face 36 of the magneto-optic element.

The polarizing analyzing system 34 includes an analyzing polarizing beam splitter 38 which divides the incident light travelling along the optical axis 22 into first and second beams. The plane of polarization of the polarizing beam splitter 38 is rotated 45° with respect to the plane of polarization of the plane polarizer 26 to cause the incident beam on partially transmitting surface 40 to be split into two components with the first component continuing along the optical axis 22 and the second component continuing on a new optical axis 42 which is orthogonal to the axis 22. In the absence of current flow in the conductor 12, the magneto-optic element 28 does not cause any rotation of the incident plane polarized light beam which results in components being outputted of equal magnitude from the polarizing analyzing system along the optical axes 22 and 42.

Gradient index lens 44 is connected to the rear surface 45 of the polarizing beam splitter 38 which is attached to a ceramic ferrule 46. The ceramic ferrule 46 and gradient index lens 44 perform the opposite function as the ceramic ferrule 18 and the gradient index lens 20 in that they convert the light beam of cross sectional area 24 down to a size for coupling to optical fiber 48. Gradient index lens 50 and ceramic ferrule 52 perform the same function as the gradient index lens 44 and the ceramic ferrule 46 in coupling the light beam travelling along the optical axis 42 which has a cross sectional area substantially identical to the cross sectional area 24, to a cross sectional area which permits coupling to optical fiber 54.

The nulling and processing circuit 56 performs several functions. The first function is to sense the magnitude of the light beams travelling along the optical fibers 48 and 54 which is accomplished by photodetectors described below with respect to FIG. 3. Second, a signal is developed which is proportional to the angle of rotation of the plane of polarization, caused by the flow of current in conductor 12, in the magneto-optic element 28. This signal is amplified and outputted on line 58 and applied to coil 60 which contains a plurality of turns which encircle the magneto-optic element 28. The magnitude of the current on output line 58 is sufficient to produce a magnetic field which opposes the magnetic field component parallel to the optical axis 22 produced by the flow of current in conductor 12 to null the rotation of the plane of polarization of the output beam of light by the magneto-optic element 28 to the plane of polarization of the light beam incident on the magneto-optic element. Accordingly, the magnitude of the current flowing in the output line 58 is directly proportional to the magnitude of the current flowing in conductor 12. Finally, an output equal to the sensed current is produced on line 62.

The preferred form of the magneto-optic element 28 is as follows. One or more layers 32 are stacked together with their easy axes of magnetization parallel to the optical axis 22. Each of the layers has an optically transparent substrate having two opposed surfaces on which is grown a magneto-optic material which exhibits the Faraday effect. The coating of Faraday effect material disposed on surfaces of each of the layers 32 may be, although not limited to, a thin film of bismuth substituted yttrium iron garnet (YIG) and the substrate may be a large lattice constant (LLC) gadolinium gallium garnet (GGG). It should be understood that while the preferred material is gadolinium gallium garnet coated with yttrium iron garnet, other known material compositions available in layers having a substrate which is optically transparent to the wavelength of light emitted by the light emitting diode 14 and a surface coating exhibiting the Faraday effect may be used with the invention. Layers 32 of the aforementioned characteristic are known in the art and commercially available from sources such as the Airtron Division of Litton Industries in which a bismuth substituted yttrium iron garnet coating with a thickness of 45 microns is deposited on a large lattice constant substrate of gadolinium gallium garnet.

Figure 2:
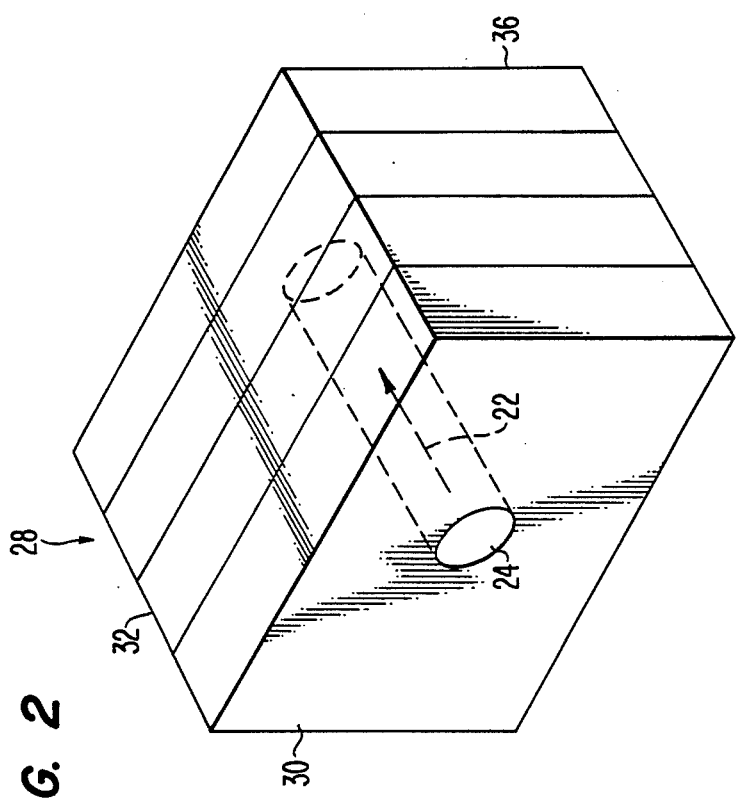
FIG. 2 illustrates an enlarged view of the Faraday effect material of FIG. 1.

FIG. 2 illustrates an enlargement of the magneto-optic element 28 illustrated in FIG. 1. It should be understood that one or more individual layers 32 of the aforementioned characteristic are attached together by a cement optically transparent to the wavelength of light emitted by the light emitting diode 14 to form a stack of layers. Each of the coatings of the Faraday effect material of the individual layers 32 exhibits an additive effect in rotating the plane of polarization of an incident plane polarized light beam. Accordingly, the angle of rotation of the plane of polarization produced by the magneto-optic material is directly proportional to the number of individual layers which are provided. The limiting factor on the number of layers which may be utilized is the overall attenuation of the light beam passing through the magneto-optic material 28. The utilization of a relatively large number of layers 32 in combination with a relatively low power light emitting diode 14 can attenuate the output light beams from the analyzing polarizing beam splitter 38 to a degree which interferes with the overall operation of the nulling and processing circuit 56. A preferred orientation of the easy magnetic axis of each of the layers 32 is that they are each parallel to the optical axis 22. As illustrated, the cross-sectional area of the incident beam 24 is smaller than the front and rear faces of each of the layers 32 which have been coated with the coating exhibiting the Faraday effect. With this relationship, the problem of the prior art involving alignment of the end of the optical fiber which is coupling light from the light emitting diode to the magneto-optic material is eliminated. Specifically, misalignments caused by the contact area of the surface to which the fiber optic element is attached being so small that the inherent divergence of light from the end of the optical fiber in a misaligned orientation will seriously interfere with the operation of the magneto-optic material and the optical axis of the incident beam of light not being precisely orthogonal to the surface to which the end of the optical fiber is attached are eliminated. With the present invention, a nonorthogonal coupling with the surface 30 of the magneto-optic material 28 will not seriously interfere with the overall operation as long as the misalignment is not so severe that the analyzing polarizing beam splitter cannot be lined up with the optical axis. While the surface area of the front surface 30 has been illustrated as being substantially larger than that of the cross sectional area of the incident light beam 24, it should be understood that the dimensions of the front surface and the faces of the individual layers 32 which are parallel thereto may be substantially reduced while still eliminating the misalignment problems present in the prior art.

Figure 3:
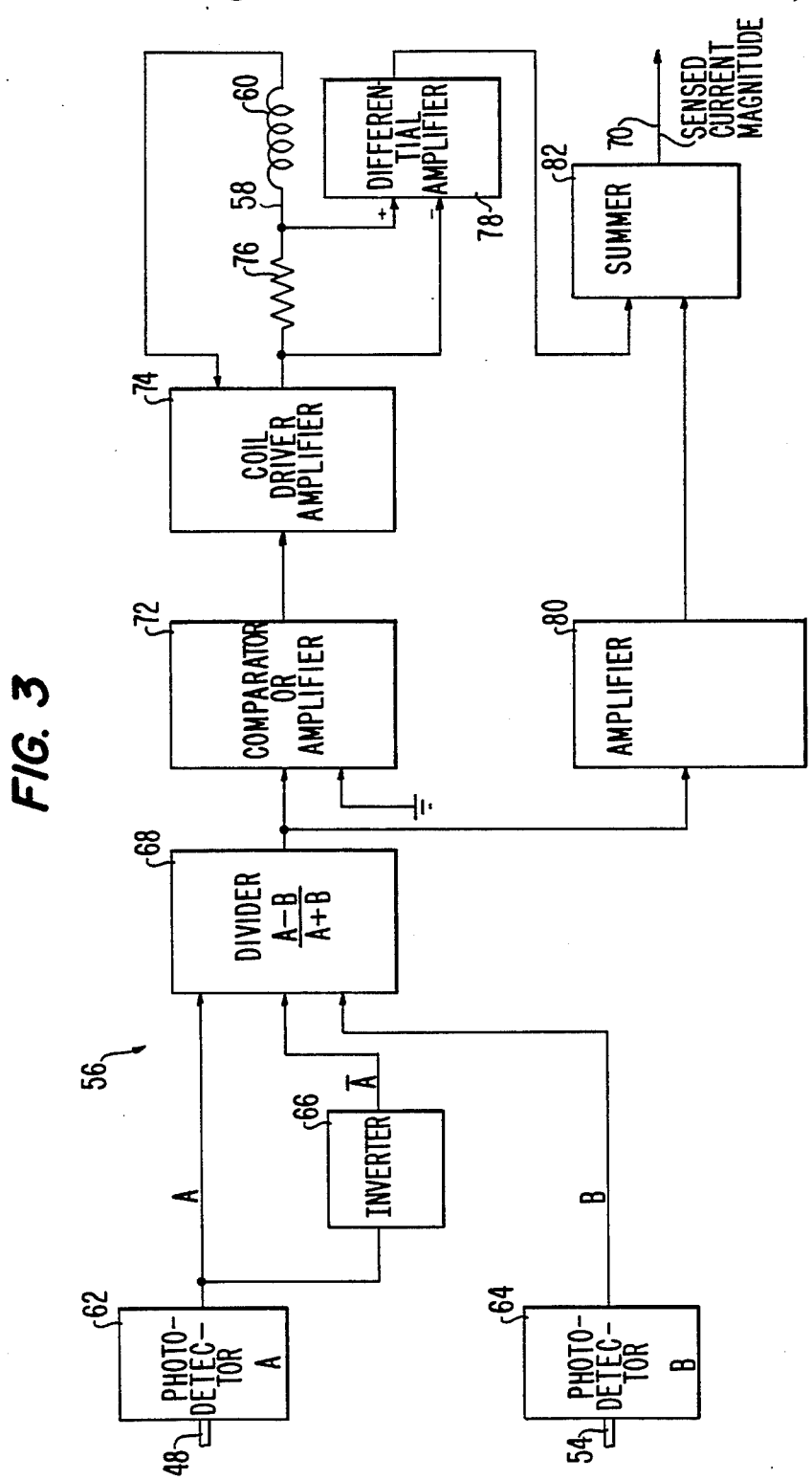
FIG. 3 illustrates the nulling and processing circuit of FIG. 1.

FIG. 3 illustrates a block diagram of the nulling and processing circuit 56 of FIG. 1. Like reference numerals identify like parts. A first photodetector 62 is coupled to the optical fiber 48 to produce an output signal A which is proportional to the intensity of the light transmitted by the optical fiber. Similarly, a second photodetector 64 is optically coupled to optical fiber 54 to produce an output signal B which is proportional to the intensity of light flowing in the optical fiber. Inverter 66 produces an inverted output $\overline{A}$. A divider 68 produces an output signal equal to the quantity $[(A-B)+(A+B)]$. This quantity is proportional to the angle of rotation of the incident light beam caused by the magneto-optic element 28 in response to the magnitude of current flowing in conductor 12. The combination of photodetectors 62 and 64, inverter 66 and divider 68 is conventional.

The present invention produces an output signal 70 which is a measure of the magnitude of current flowing in the conductor 12. As stated above, the output 70 is proportional to either to DC or AC currents being measured. The present invention operates to measure a first range of currents from zero to a first magnitude having either of a first or second polarity by null detection by producing a current of a magnitude which is applied to the coil 60 with a magnitude which produces a rotation of the plane of polarization equal in magnitude and opposite to the angle of rotation of the plane of polarization caused by the magnetic field of the current flowing in the conductor 12. The present invention also operates for a second range of current values which extend from the first magnitude to a second magnitude having the first or second polarity, which typically is 200 or 300% of the first magnitude, for measuring higher values including transients which either have frequency components at frequencies too high to be nulled as a consequence of the inductance of the coil 60 or further having a magnitude too great to permit current of a magnitude to be generated to cancel the rotation of the plane of polarization produced by the current flowing in the conductor 12. The output signal from the divider 68, which is proportional to the angle of rotation of the plane of polarization caused by the current flowing in the conductor 12 and the current flowing in coil 60, is applied to a comparator or amplifier 72. The comparator or amplifier 72 functions to provide an output of a first level when the output from the divider 68 is greater than a predetermined value and producing an output of a second level when the output from the divider is less than the predetermined value. As is known, the gain of a comparator is relatively high which produces an output signal reaching saturation for relatively small level input signals. If an amplifier 72 is used instead of a comparator, the gain of the amplifier may be smaller so that saturation in the output signal is not reached for small level input signals. The amplifier preferably should have a linear amplification characteristic but the invention is not limited thereto. The output of the comparator or amplifier 72 is applied to a coil driver amplifier 74 which further amplifies the output from the comparator or amplifier to a level which is applied to coil 60 to null the rotation of the plane of polarization in the first current range. A resistance 76 is coupled between the coil driver amplifier 74 and the coil 60 for developing a voltage proportional to the current flowing in the coil 60. Differential amplifier 78 produces an output signal proportional to the current flowing in the coil 60. The output of the divider 68 is also applied to amplifier 80 which produces an output which is proportional to the output of the divider. The gain of the comparator 72 is substantially higher than the gain of the amplifier 80. If an amplifier 72 is used in place of a comparator, the gain of the amplifiers may be chosen to be substantially equal. The outputs from the differential amplifier 78 and the amplifier 80 are summed by summer 82 which produces the aforementioned output signal 70 equal to the magnitude of the current flowing in the conductor 12. By appropriately scaling the resistor 76 or the gain of amplifier 80, it is possible to produce an output signal 70 which is a linear function of the magnitude of the current flowing in the conductor 12 when the magnitude of the current flowing in the conductor 12 is so great that the coil driver amplifier 74 cannot output sufficient current to null the rotation of the plane of polarization caused by the current flowing in the conductor. Thus, the invention provides the dual benefit of the accuracy of null detection in a first current range and further permits a less accurate output in a higher current range in which null detection is not utilized. Finally, the overall frequency response of the present invention is enhanced by not nulling the rotation of the plane of polarization for high current values. By not attempting to null the rotation of the plane of polarization for high current values, the number of turns on the coil 60 may be reduced thereby lowering the inductance of the coil to permit higher frequency response.

While the invention has been described in terms of a preferred embodiment, it should be understood that numerous modifications may be made thereto without departing from the spirit and scope of the appended claims. It is intended that all such modifications fall within the scope of the appended claims. While the disclosed embodiment of the invention is described as a current measuring device, it should be understood that the invention is applicable to measuring the magnitude of magnetic fields.

We claim:

1. In a magneto-optical current sensor for measuring the magnitude of current flowing in a conductor with a magneto-optic material, through which a plane polarized light beam is transmitted that is oriented in parallel with a component of a magnetic field produced by the current which causes rotation of the plane polarized light beam by an amount proportional to the current, a nulling circuit for producing a current which is to be applied to a coil magnetically coupled with the magneto-optic material to cause the plane of polarization of the light beam to be rotated in opposition to the rotation caused by the sensed current comprising:

(a) means for providing a signal proportional to the angle of rotation in the magneto-optic material;

(b) a comparator producing an output of a first level when the signal is greater than a predetermined value and producing an output of a second level when the signal is less than the predetermined value wherein;

(c) means, coupled to the comparator, for producing current which is applied to the coil and a signal proportional to the current flowing in the coil;

(d) an amplifier, coupled to the means for providing a signal proportional to the angle of rotation, for providing an amplified output signal of the signal proportional to the angle of rotation; and (e) means, for summing the output signal from the amplifier and the signal proportional to the current flowing in the coil, to produce an output signal proportional to the current flowing in the conductor.

2. A nulling circuit in accordance with claim 1 wherein:
the comparator has a gain and the amplifier has a gain and the gain of the comparator is larger than the gain of the amplifier.

3. A nulling circuit in accordance with claim 2 wherein the means for producing the current which is applied to the coil and a signal proportional to the current flowing in the coil comprises:
(a) a coil driving amplifier, coupled to the output of the comparator, for amplifying the output signal from the comparator;
(b) a resistor coupled in series between an output of the coil driving amplifier and the coil; and
(c) a differential amplifier having a pair of inputs respectively coupled across the resistor for amplifying a voltage drop across the resistor to produce an output which is proportional to the current flowing in the coil, the output of the differential amplifier being coupled to the means for summing.

4. A magneto-optical current sensor for measuring the magnitude of current flowing in a conductor with a magneto-optic material through which a plane polarized light beam is transmitted that is oriented in parallel with a component of a magnetic field produced by the current which causes rotation of the plane polarized light beam by an amount proportional to the current, comprising:
(a) first means, responsive to a sensed angle rotation of the plane of polarization, for producing a current which is applied to a coil magnetically linked with the magneto-optic material to cause the plane of polarization of the light beam to be rotated by an amount equal in magnitude and opposite in direction to the rotation caused by the sensed current when the sensed current is in a first range of current values;
(b) second means, responsive to a sensed angle of rotation of the plane of polarization, for producing a signal which is proportional to the sensed current in a second range of current values larger in magnitude than the first range of current values; and
(c) output means, responsive to the first means for producing a current and the second means for producing a signal, for producing an output signal proportional to the current flowing in the conductor in the first and second ranges.

5. A magneto-optical current sensor in accordance with claim 4 wherein:
(a) the first range is from zero to a first current magnitude having either of two possible polarities; and
(b) the second range is from the first current magnitude to a second larger current magnitude having either of the two possible polarities.

6. A magneto-optical current sensor in accordance with claim 4 wherein:
(a) the first means includes a comparator producing an output of a first polarity when a signal proportional to the sensed angle of rotation is greater than a predetermined value and an output of a second polarity when the signal proportional to the sensed angle of rotation is less than the predetermined value and means, coupled to the comparator, for producing a signal proportional to the sensed angle of rotation of the plane of polarization;
(b) the second means includes an amplifier coupled to the signal proportional to the sensed angle of rotation for providing an amplified output signal; and
(c) the output means includes a means for summing the output signal from the amplifier and the means for producing a signal proportional to the current flowing in the coil to produce an output signal proportional to the current flowing in the conductor.

7. A magneto-optical current sensor in accordance with claim 6 wherein:
the comparator has a gain and the amplifier has a gain and the gain of the comparator is larger than the gain of the amplifier.

8. A magneto-optical current sensor in accordance with claim 6 wherein the first means for producing the current which is applied to the coil comprises:
(a) a coil driving amplifier, coupled to the output of the comparator, for amplifying the output signal from the comparator;
(b) a resistor coupled between an output of the coil driving amplifier and the coil; and
(c) a differential amplifier having a pair of inputs respectively coupled across the resistor for amplifying a voltage drop across the resistor to produce an output which is proportional to the current flowing in the coil, the output of the differential amplifier being coupled to the means for summing.

9. A magneto-optic current sensor in accordance with claim 4 wherein:
(a) the first means includes a means, responsive to the sensed angle of rotation, for producing an output signal of a first level when the signal proportional to the sensed angle of rotation is greater than a predetermined value and an output signal of a second level when the signal proportional to the sensed angle of rotation is less than the predetermined value and means, coupled to the means for producing an output signal, for producing a signal proportional to current flowing in the coil and the current which is applied to the coil;
(b) the second means includes an amplifier, coupled to the second means for producing a signal proportional to the sensed angle of rotation, for providing an amplified output signal; and
(c) the output means includes a means for summing a signal which is a function of the output signal and the amplified output signal to produce a signal proportional to the current flowing in the conductor.

10. A magneto-optic current sensor in accordance with claim 9 wherein:
the first amplifier has a gain and the second amplifier has a gain and the gain of the first amplifier is larger than the gain of the second amplifier.

11. A magneto-optic current sensor in accordance with claim 9 wherein the means for producing a signal proportional to the current flowing in the coil and the current which is applied to the coil comprises:
(a) a coil driving amplifier, coupled to the output of the first amplifier, for amplifying the output signal from the first amplifier;

(b) a resistor coupled between an output of the coil driving amplifier and the coil; and (c) a differential amplifier having a pair of inputs respectively coupled across the resistor for amplifying a voltage drop across the resistor to produce an output which is proportional to the current flowing in the coil, the output of the differential amplifier being coupled to the means for summing.

12. A magneto-optic current sensor for measuring the magnitude of current flowing in a conductor comprising:

(a) a light source for emitting light to be transmitted;

(b) means, optically coupled to the light source, for collimating the light emitted from the light source into a substantially parallel beam having a cross-sectional area;

(c) a polarizer, optically coupled to the beam, for polarizing the light beam into a first plane of polarization;

(d) a magneto-optic element, optically coupled to the polarizer, which receives the light beam on an input side with the light beam passing through the element without substantial internal reflection and outputs the light on a discharge side, the element rotating the plane of polarizing of the input beam in proportion to a magnetic field coupled in parallel to an optical axis of the beam passing through the element and comprising at least one layer with each layer having a substrate coated with a material exhibiting the Faraday effect with each layer having a cross-sectional area of coating intercepted by the light beam which is equal to or greater in surface area than the cross-sectional area of the light beam intercepting the layer;

(e) means, optically coupled to the light beam outputted from the output of the magneto-optic element, for producing an output proportional to the magnitude of the rotation of the plane of polarization in the element;

(f) first means, responsive to the output proportional to the magnitude of the rotation of the plane of polarization, for producing a current which is applied to a coil magnetically coupled with the magneto-optic element to cause the plane of polarization to be rotated by an amount equal in magnitude and opposite in direction to the rotation caused by the sensed current when the sensed current is in a first range of current values;

(g) second means, responsive to the output proportional to the magnitude of the rotation of the plane of polarization, for producing a signal which is proportional to the sensed current when the sensed current is in a second range of current values; and (h) output means, responsive to the first means for producing a current and the second means for producing a signal for producing an output signal proportional to the current flowing in the conductor in the first and second ranges.

13. A sensor in accordance with claim 12 wherein: the magneto-optic element has a plurality of layers with each surface of each layer having a coating rotating the plane of polarization of the light beam intercepting the coating of the layer by a fixed amount with the amount of rotation of the light beam by the element being directly proportional to the number of layers.

14. A sensor in accordance with claim 13 wherein: each substrate has opposed sides which are coated with the material exhibiting the Faraday effect with the light beam passing through the opposed sides of each substrate of each layer of the magneto-optic element.

15. A sensor in accordance with claim 14 wherein: each layer of the element has an easy axis of magnetization and the layers of the magneto-optic element are stacked together with the easy axis of each of the layers being parallel to each other with the optical axis of the light beam passing through the element being parallel to the easy axis of the layers.

16. A sensor in accordance with claim 15 wherein each layer comprises:

(a) a substrate of gadolinium gallium garnet; and (b) a coating containing yttrium iron garnet disposed on opposed surfaces of the substrate.

17. A sensor in accordance with claim 13 wherein the means optically coupled to the light source comprises:

(a) an optical fiber having first and second ends, the first end being optically coupled to the light source; and (b) a gradient index lens having a first surface optically coupled to the second end of the optical fiber and a second surface for outputting the collimated beam of light.

18. A sensor in accordance with claim 17 wherein: the lens is a 0.25 pitch gradient index lens.

19. A sensor in accordance with claim 13 wherein:

(a) the first range is from zero to a first current magnitude having either of two possible polarities; and (b) the second range is from the first current magnitude to a second larger current magnitude having either of the two possible polarities.

20. A sensor in accordance with claim 19 wherein:

(a) the first means includes a comparator producing an output of a first level when a signal proportional to the sensed angle of rotation is greater than a predetermined value and an output of a second level when the signal proportional to the sensed angle of rotation is less than the predetermined value and means, coupled to the comparator, for producing a signal proportional to current flowing in the coil and the current which is applied to the coil;

(b) the second means includes an amplifier, coupled to the signal proportional to the sensed angle of rotation, for providing an amplified output signal; and (c) the output means includes a means for summing the output signal from the amplifier and the signal proportional to the current flowing in the coil and the current which is applied to the coil to produce an output signal proportional to the current flowing in the conductor.

21. A circuit in accordance with claim 20 wherein: the comparator has a gain and the amplifier has a gain and the gain of the comparator is larger than the gain of the amplifier.

22. A sensor in accordance with claim 20 wherein the means for producing a signal proportional to the current flowing in the coil and the current which is applied to the coil comprises:

(a) a coil driving amplifier, coupled to the output of the comparator, for amplifying the output signal from the comparator;

(b) a resistor coupled between an output of the coil driving amplifier and the coil; and (c) a differential amplifier having a pair of inputs respectively coupled across the resistor for amplifying a voltage drop across the resistor to produce an output which is proportional to the current flowing in the coil, the output of the differential amplifier being coupled to the means for summing.

23. A sensor in accordance with claim 12, wherein:
(a) the first means includes a means, responsive to the sensed angle of rotation, for producing an output signal of a first level when the signal proportional to the sensed angle of rotation is greater than predetermined value and an output signal of a second level when the signal proportional to the sensed angle of rotation is less than the predetermined value and means, coupled to the means for producing an output signal, for producing a signal proportional to current flowing in the coil and the current which is applied to the coil;
(b) the second means includes an amplifier, coupled to the second means for producing a signal proportional to the sensed angle of rotation, for provided an amplified output signal; and
(c) the output means includes a means for summing a signal which is a function of the output signal and the amplified output signal to produce a signal proportional to the current flowing in the conductor.

24. A sensor in accordance with claim 23 wherein:
the first amplifier has a gain and the second amplifier has a second gain and the gain of the first amplifier is larger than the gain of the second amplifier.

25. A sensor in accordance with claim 23 wherein the means for producing a signal proportional to the current flowing in the coil and the current which is applied to the coil comprises:
(a) a coil driving amplifier, coupled to the output of the first amplifier, for amplifying the output signal from the first amplifier;
(b) a resistor coupled between an output of the coil driving amplifier and the coil; and
(c) a differential amplifier having a pair of inputs respectively coupled across the resistor for amplifying a voltage drop across the resistor to produce an output which is proportional to the current flowing in the coil, the output of the differential amplifier being coupled to the means for summing.

26. In magneto-optical current sensor for measuring the magnitude of current flowing in a conductor with a magneto-optic material, through which a plane polarized light beam is transmitted that is oriented in parallel with a component of a magnetic field produced by the current which causes rotation of the plane polarized light beam by an amount proportional to the current, a nulling circuit for producing a current which is to be applied to a coil magnetically coupled to the magneto-optic material to cause the plane of polarization of the light beam to be rotated in opposition to the rotation caused by the sensed current comprising:
(a) means for providing a first signal proportional to the angle of rotation in the magneto-optic material;
(b) means, responsive to the first signal, for producing an output signal having a first level when the first signal is greater than a predetermined value and a second level when the first signal is less than the predetermined value;
(c) means, responsive to the first signal, for producing a signal proportional to the current flowing in the coil and the current which is applied to the coil;
(d) an amplifier, coupled to the means for providing a first signal proportional to the sensed angle of rotation, for providing an amplified output signal of the first signal proportional to the angle of rotation; and
(e) means, for summing a signal which is a function of the output signal and the amplified output signal, to produce an output signal proportional to the current flowing in the conductor.

27. A nulling circuit in accordance with claim 26 wherein:
the first amplifier has a gain and the second amplifier has a gain and the gain of the second amplifier is less than the gain of the first amplifier.

28. A nulling signal in accordance with claim 27 wherein the means for producing a signal proportional to the current flowing in the coil and the current which is applied to the coil comprises:
(a) a coil driving amplifier, coupled to the output of the first amplifier, for amplifying the output signal from the first amplifier;
(b) a resistor coupled in series between an output of the coil driving amplifier and the coil; and
(c) a differential amplifier having a pair of inputs respectively coupled across the resistor for amplifying a voltage drop across the resistor to produce an output which is proportional to the current flowing in the coil, the output of the differential amplifier being coupled to the means for summing.

* * * * *